(12) United States Patent
Cho et al.

(10) Patent No.: US 9,343,700 B2
(45) Date of Patent: May 17, 2016

(54) DISPLAY APPARATUS AND METHOD OF FABRICATING THE SAME

(71) Applicant: Samsung Display Co., Ltd., Yongin-City, Gyeonggi-Do (KR)

(72) Inventors: Yoon-Hyeung Cho, Yongin (KR); Min-Ho Oh, Yongin (KR); Byoung-Duk Lee, Yongin (KR); Yong-Tak Kim, Yongin (KR); Jong-Woo Kim, Yongin (KR); Yong-Chan Ju, Yongin (KR); Yun-Ah Chung, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/284,300

(22) Filed: May 21, 2014

(65) Prior Publication Data

US 2015/0048326 A1    Feb. 19, 2015

(30) Foreign Application Priority Data

Aug. 14, 2013   (KR) .................. 10-2013-0096901

(51) Int. Cl.
*H01L 51/52* (2006.01)
*H01L 27/32* (2006.01)

(52) U.S. Cl.
CPC ......... *H01L 51/5253* (2013.01); *H01L 27/3244* (2013.01); *Y10T 428/239* (2015.01)

(58) Field of Classification Search
CPC ............ H01L 51/5253; H01L 51/5256; H01L 51/5338; H01L 23/293
See application file for complete search history.

(56) References Cited

U.S. PATENT DOCUMENTS

| | | | | |
|---|---|---|---|---|
| 7,741,769 B2* | 6/2010 | Hayashi | ........................ | 313/498 |
| 2003/0218422 A1* | 11/2003 | Park et al. | ...................... | 313/512 |
| 2008/0309226 A1 | 12/2008 | Kim et al. | | |
| 2009/0191342 A1* | 7/2009 | Chu et al. | ...................... | 427/264 |
| 2009/0267487 A1* | 10/2009 | Kwack et al. | .................. | 313/503 |
| 2011/0130588 A1* | 6/2011 | Uetani et al. | .................. | 560/103 |
| 2011/0291116 A1 | 12/2011 | Kang et al. | | |
| 2012/0091477 A1* | 4/2012 | Kim | ................................ | 257/88 |
| 2012/0146492 A1* | 6/2012 | Ryu et al. | ...................... | 313/512 |
| 2014/0027739 A1* | 1/2014 | van de Weijer et al. | ........ | 257/40 |

FOREIGN PATENT DOCUMENTS

| | | |
|---|---|---|
| KR | 10-2006-0031968 | 4/2006 |
| KR | 10-0873704 | 12/2008 |
| KR | 10-2011-0130925 | 12/2011 |
| KR | 10-2012-0065049 | 6/2012 |
| WO | 2006/041240 A1 | 4/2006 |

* cited by examiner

*Primary Examiner* — John C Ingham
(74) *Attorney, Agent, or Firm* — Innovation Counsel LLP

(57) ABSTRACT

Provided is a display apparatus including: a substrate including a display area and a periphery; a display element disposed on the display area of the substrate; and an encapsulation layer including a first inorganic layer, an organic layer, and a second inorganic layer that are sequentially formed to cover the display element, wherein the organic layer includes: a first organic layer formed on of the periphery of the substrate and on the substrate; and a second organic layer formed on the first inorganic layer so as to overlap the display element.

20 Claims, 5 Drawing Sheets

DISPLAY APPARATUS AND METHOD OF FABRICATING THE SAME

RELATED APPLICATIONS

This application claims priority under 35 U.S.C. §119 to Korean Patent Application No. 10-2013-0096901 filed on Aug. 14, 2013 in the Korean Intellectual Property Office, the disclosure of which is incorporated herein in its entirety by reference.

BACKGROUND

1. Field

One or more embodiments of the inventive concept relate to a display apparatus and a method of fabricating the same.

2. Description of the Related Art

As technologies develop, the performance of display apparatuses is improved. Recently, screen size of a flat panel display apparatus has been increased and the weight thereof has been reduced.

Examples of the flat panel display apparatuses include liquid crystal display (LCD) apparatuses, plasma display panel (PDP) apparatuses, field emission display (FED) apparatuses, electroluminescence display (ELD) apparatuses, electrophoresis display (EPD) apparatuses, and organic light-emitting display apparatuses.

These flat panel display apparatuses are light-weight, have relatively small sizes compared to a cathode ray tube (CRT) and are advantageous for making large size. Thus, the demand for the flat panel display apparatuses has been explosively increasing.

Also, demand for a flexible display, which is bendable like a paper, has increased too.

A flat panel display apparatus may include an encapsulation layer for encapsulating a display device so as to prevent an external oxygen or moisture from permeating into the display device. Encapsulation layer has been used in flexible, rollable, or foldable displays.

SUMMARY

One or more embodiments of the inventive concept include a display apparatus that may improve the reliability of an encapsulation layer, and a method of fabricating the same.

Additional aspects will be set forth in part in the description which follows and, in part, will be apparent from the description, or may be learned by practice of the presented embodiments.

According to one or more embodiments of the inventive concept, a display apparatus includes: a substrate including a display area and a periphery; a display element disposed on the display area of the substrate; and an encapsulation layer including a first inorganic layer, an organic layer, and a second inorganic layer that are sequentially formed to cover the display element, wherein the organic layer includes: a first organic layer formed on the periphery of the substrate; and a second organic layer formed on the first inorganic layer so as to overlap the display element.

The first organic layer may have greater adhesion strength than adhesion strength of the second organic layer.

The second organic layer may have greater light transmittance than light transmittance of the first organic layer.

The organic layer may be formed using an inkjet method or a jet dispenser.

The first organic layer may be formed using an epoxy-based material or an acryl-based material.

The first organic layer is formed using an inkjet method and the first organic layer may have viscosity of about 10 to 20 centi-poise (CPS).

The first organic layer is formed using a jet dispenser and the first organic layer may have viscosity of about 1000 to about 100,000 CPS.

The second organic layer may have smaller surface tension than surface tension of the first organic layer.

The second organic layer may have a size that is equal to or greater than a size of the display element, so as to overlap the display element.

The display element may include a plurality of organic light-emitting display devices that are spaced apart from each other by a gap.

The substrate may be a flexible substrate.

According to one or more embodiments of the inventive concept, a display apparatus includes: a substrate including a display area and a periphery; a display element disposed on the display area of the substrate; and an encapsulation layer including an inorganic layer and an organic layer that are alternately formed, so as to cover the display element, a top layer of the encapsulation layer being an inorganic layer, wherein the organic layer includes: a first organic layer formed on the periphery area of the substrate not to overlap the display element; and a second organic layer formed on the inorganic layer so as to overlap the display element.

The first organic layer and the second organic layer may be formed using an inkjet method or a jet dispenser.

The first organic layer may have greater adhesion strength than adhesion strength of the second organic layer and may include an inorganic filler.

The second organic layer may have greater light transmittance than light transmittance of the first organic layer and may have a size that is equal to or greater than a size of the display element, so as to overlap the display element.

The substrate may be a flexible substrate, and the display element may include a plurality of organic light-emitting devices that are spaced apart from each other by a gap.

According to one or more embodiments of the inventive concept, a method of fabricating a display apparatus includes: forming a display element on a substrate, the substrate including a display area and a periphery; forming a first inorganic layer on the substrate so as to cover the display element; forming a first organic layer on the periphery of the substrate not to overlap the display element; forming a second organic layer on the first inorganic layer so as to overlap the display element; and forming a second inorganic layer on the first organic layer and the second organic layer.

The first organic layer and the second organic layer may be formed using an inkjet method or a jet dispenser.

The first organic layer may have greater adhesion strength than adhesion strength of the second organic layer, and the second organic layer may have greater light transmittance than light transmittance of the first organic layer.

The substrate may be a flexible substrate, and the display element may include a plurality of organic light-emitting devices that are spaced apart from each other by a gap.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
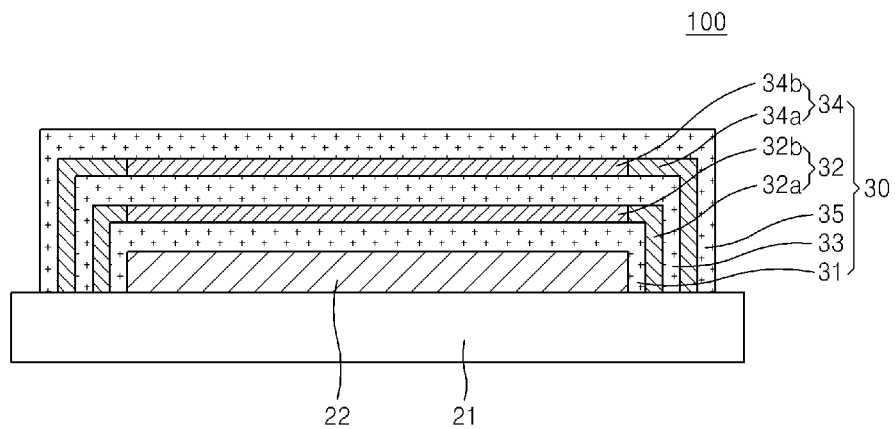
FIG. 1 is a cross-sectional view schematically illustrating a structure of a display apparatus according to an embodiment of the inventive concept.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

It will be understood that when a layer is referred to as being "formed on," a substrate or another layer, it can be directly or indirectly formed on the substrate or the other layer. That is, for example, intervening layers may be present.

It will be further understood that the terms may be used herein to describe embodiments and are not intended to limit the invention. As used herein, the singular forms "a," "an" and "the" are intended to include the plural forms as well, unless the context clearly indicates otherwise. It will be further understood that the terms "comprises" and/or "comprising" used herein do not preclude the presence or addition of one or more other components, steps, operations and/or devices. It will be further understood that although the terms "first", "second", etc. may be used herein to describe various components, these components should not be limited by these terms. These components are only used to distinguish one component from another.

When a certain embodiment may be implemented differently, a specific process order may be performed differently from the described order. For example, two consecutively described processes may be performed substantially at the same time or performed in an order opposite to the described order. As used herein, the term "and/or" includes any and all combinations of one or more of the associated listed items. Expressions such as "at least one of," when preceding a list of elements, modify the entire list of elements and do not modify the individual elements of the list.

Figure 2:
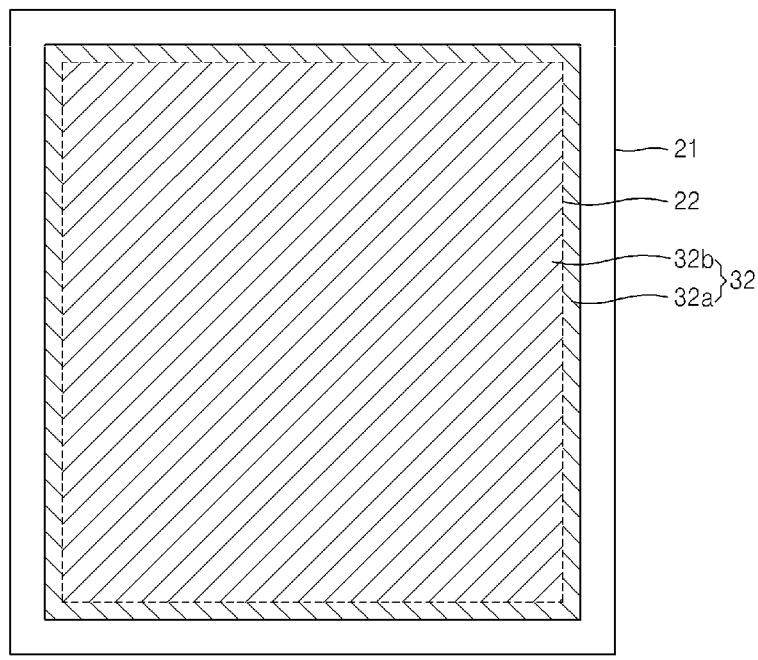
FIG. 2 is a plan view schematically illustrating an organic layer formed on a first inorganic layer of the display apparatus illustrated in FIG. 1.

FIG. 1 is a cross-sectional view schematically illustrating a structure of a display apparatus 100 according to an embodiment of the inventive concept, and FIG. 2 is a plan view schematically illustrating an organic layer 32 formed on a first inorganic layer 31 of the display apparatus 100 illustrated in FIG. 1.

Referring to FIGS. 1 and 2, the display apparatus 100 includes a substrate 21 including a periphery and a display area which displays images. A display element 22 and an encapsulation layer 30 for encapsulating the display element 22 are disposed on the substrate.

The encapsulation layer 30 is formed to prevent external air, such as external oxygen or moisture, from permeating into the display element 22. The encapsulation layer 30 includes at least one inorganic layer 31 and at least one organic layer 32 that are alternately stacked, and a top layer of the encapsulation layer 30 is an inorganic layer 35.

In one or more embodiments of the inventive concept, the organic layer 32 includes a first organic layer 32a formed on a periphery of the first inorganic layer 31 and on the substrate 21 not to overlap the display element 22 and a second organic layer 32b formed on the display area of the first inorganic layer 31 so as to overlap the display element 22.

The first organic layer 32a and the second organic layer 32b have different characteristics. For example, the first organic layer 32a is formed on the periphery of the display panel 22 and the substrate 21 and thus may be formed of a material having high adhesion strength to the substrate and high moisture permeability. The second organic layer 32b is formed on the display element 22 and thus may be formed of a material having high transparency. The organic layer 32 may include the first organic layer 32a and the second organic layer 32b having different characteristics and may be formed using an inkjet method or a jet dispenser.

Describing the display apparatus 100 in more detail, the substrate 21 may be formed of a transparent glass material having a main ingredient of $SiO_2$ or flexible plastic material. The substrate 21 is not limited thereto and may be formed of one of various materials such as ceramic, metal, and the like.

The substrate 21 may be flexible substrate that may be bent. In some embodiment, the substrate 21 may be a fiber reinforced plastic (FRP) substrate. In some embodiment, the substrate 21 may include a fibrous tissue or/and a polymer resin. The fibrous tissue may include an optical fiber or a yarn or fabric using the optical fiber. The polymer resin may include an epoxy resin or acrylic resin.

The display element 22 is implemented with a panel for displaying a character, a figure, or an image and may include a plurality of display devices and/or a driving device for driving the plurality of display devices. The display devices may be liquid crystal display (LCD) devices, organic light-emitting display devices, plasma display panel (PDP) devices, or electrophoresis display (EPD) devices.

In some embodiment, the display devices may include signal lines, such as gate lines for transmitting gate signals and data lines for transmitting data signals, switching devices connected to the gate lines and the data lines, and pixel electrodes which are connected to the switching devices and to which the data signals are applied.

The encapsulation layer 30 that is formed to prevent external air, such as external oxygen or moisture, from permeating into the display element 22 may be formed to surround a top surface and side surfaces of the display element 22.

The encapsulation layer 30 includes at least one inorganic layer 31 and at least one organic layer 32 that are alternately stacked, and a top layer of the encapsulation layer 30 may be the inorganic layer 35.

The thickness of the inorganic layer 31 may be properly determined according to productivity or device characteristics. The inorganic layer 31 is thin but has high density and thus has characteristics of a barrier to moisture and oxygen.

The inorganic layer 31 may be a single layer including an oxide, a nitride or an oxynitride, or a combination thereof. In detail, the inorganic layer 31 may include at least one of silicon nitride (SiNx), $Al_2O_3$, silicon dioxide ($SiO_2$), titanium dioxide ($TiO_2$), silicon oxynitride (SiON), AZO, zinc oxide (ZnO), and zirconium oxide (ZrO).

The inorganic layer 31 may have a layer structure including a low melting point glass such as tin oxide (SnO). This is just an example, and embodiments of the inventive concept are not limited thereto.

The thickness of the organic layer 32 may be properly determined according to characteristics of the inorganic layer 31, productivity, and device characteristics. The organic layer 32 may have a function of planarization and/or a stress adjustment in addition to the function of blocking external air. The organic layer 32 may include the first and second organic layers 32a and 32b having different characteristics and may be formed using an inkjet method or a jet dispenser.

Because the first organic layer 32a is formed on the periphery of the substrate 21, an opaque material, to which an inorganic filler is added, may be used to form the first organic layer 32a so as to improve adhesion strength or moisture permeability of the first organic layer 32a. For example, the first organic layer 32a may be formed using epoxy-based material or acryl-based material having high adhesion strength. However, embodiments of the inventive concept are not limited thereto. The adhesion strength of the first organic layer 32a may be greater than adhesion strength of the second organic layer 32b. When the first organic layer 32a is formed using an inkjet method, the first organic layer 32a may be formed using a material having viscosity of about 10 to about 20 CPS. When the first organic layer 32a is formed using a jet dispenser, the first organic layer 32a may be formed using a high viscosity material having viscosity of about 1000 to about 100,000 CPS.

Because the first organic layer 32a may be closely adhered to the substrate 21 and the inorganic layer 31, even when the display apparatus 100 has flexible characteristics, the first organic layer 32a prevents external air from permeating edges of the display apparatus 100 so that the reliability of the display apparatus 100 may be improved. Because the first organic layer 32a is formed using a material having high adhesion strength, the second organic layer 32b may be formed only on the display element 22 and may serve as a dam for preventing external air from overflowing into the other area.

The second organic layer 32b is formed in a partial area of the first inorganic layer 31 so as to overlap the display element 22. The organic layer 32 may be formed to cover the first inorganic layer 31 using the first organic layer 32a and the second organic layer 32b.

Because the second organic layer 32b is formed on the display element 22 on which an image is displayed, the second organic layer 32b may be formed using an acryl-, silicon-, or epoxy-based material having high transmittance and low outgassing (impurity). For example, the second organic layer 32b may be formed using a material having light transmittance of about 95%. The light transmittance of the second organic layer 32b may be greater than the light transmittance of the first organic layer 32a. Because the leveling characteristics of the second organic layer 32b formed on the display element 22 are required, the second organic layer 32b may be formed using a material having smaller surface tension than that of the first organic layer 32a. However, embodiments of the inventive concept are not limited thereto.

A second inorganic layer 33 is formed on the substrate 21 so as to cover the organic layer 32.

The second inorganic layer 33 may be a single layer including an oxide or metal nitride or a stacked layer. In detail, the second inorganic layer 33 may include at least one of SiNx, $Al_2O_3$, $SiO_2$, $TiO_2$, SiON, AZO, ZnO, and ZrO. The second inorganic layer 33 may include a low melting point glass, such as SnO. This is just an example, and embodiments of the inventive concept are not limited thereto.

First and second organic layers 34a and 34b having different characteristics may be formed on the second inorganic layer 33 using the inkjet method or the jet dispenser.

The first organic layer 34a may be formed to cover edges and side surfaces of the second inorganic layer 33 not to overlap the display element 22. The first organic layer 34a may be formed using an opaque material to which an inorganic filler is added, so as to improve adhesion strength or moisture permeability. For example, when the first organic layer 34a may be formed using an epoxy-based or acryl-based material having high adhesion strength. However, embodiments of the inventive concept are not limited thereto. When the first organic layer 34a is formed using the inkjet method, the first organic layer 34a may be formed using a material having viscosity of about 10 to about 20 CPS. When the first organic layer 34a is formed using the jet dispenser, the first organic layer 34a may be formed using a high viscosity material having viscosity of about 1000 to about 100,000 CPS.

Because the first organic layer 34a may be strongly adhered to the substrate 21 and the second inorganic layer 33, even when the display apparatus 100 has flexible characteristics, the first organic layer 34a prevents external air from permeating the edges of the display apparatus 100 into the display element 22 so that the reliability of the display apparatus may be improved.

The second organic layer 34b is formed on the second inorganic layer 33 so as to overlap the display element 22. Because the second organic layer 34b is formed on the display element 22 on which the image is displayed, the second organic layer 34b may be formed using an acryl-based material, silicon-based material, or epoxy-based material having high transmittance and low outgassing (impurity) characteristic. For example, the second organic layer 34b may be formed using a material having light transmittance of about 95%. Because the leveling characteristics of the second organic layer 34b formed on the display element 22 are required, the second organic layer 34b may be formed using a material having small surface tension. However, embodiments of the inventive concept are not limited thereto.

A third inorganic layer 35 is formed on the substrate 21 so as to cover the organic layer 34.

The third inorganic layer 35 may be a single layer including an oxide, a nitride or an oxynitride, or a combination thereof. In detail, the third inorganic layer 35 may include at least one of SiNx, $Al_2O_3$, $SiO_2$, $TiO_2$, SiON, AZO, ZnO, and ZrO.

The third inorganic layer 35 may include a low melting point glass, such as SnO. This is just an example, and embodiments of the inventive concept are not limited thereto.

In the drawings, the encapsulation layer 30 is formed in such a way that the first inorganic layer 31, the organic layer 32, the second inorganic layer 33, the organic layer 34 and the third inorganic layer 35 are sequentially stacked on the display element 22. However, the stacked structure is not limited thereto. For example, the encapsulation layer 30 may include a structure in which the first inorganic layer 31, the organic layer 32 and the second inorganic layer 33 are sequentially stacked.

Each of the second organic layers 32b and 34b formed to overlap the display element 22 may have a size that is equal to or greater than the size of the display element 22, so as to cover the display element 22.

Also, a member for reducing external light reflection, such as a polarization film (not shown), a phase difference film (not shown), or a filter (not shown) or a member for color definition may be additionally included in the top surface of the encapsulation layer 30.

FIGS. 3 through 10 are cross-sectional views schematically illustrating a method of fabricating the display apparatus 100, according to an embodiment of the inventive concept.

Figure 3:
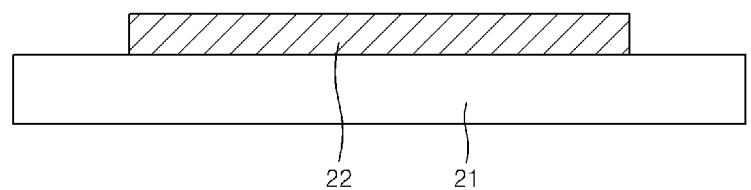
FIGS. 3 through 10 are cross-sectional views schematically illustrating a method of fabricating a display apparatus, according to an embodiment of the inventive concept.

Referring to FIG. 3, a display element 22 is formed on a substrate 21. The display element 22 may include a plurality of display devices and a driving device and may be formed using various formation methods according to the types of the plurality of display devices and the driving device.

Figure 4:
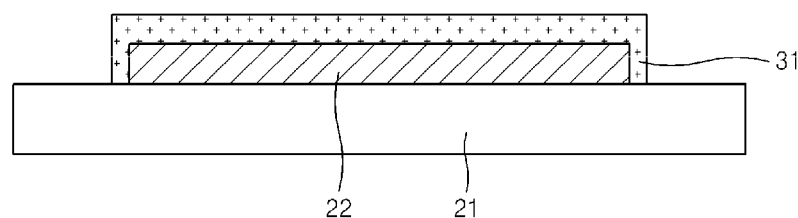

Referring to FIG. 4, a first inorganic layer 31 is formed on the display element 22. The first inorganic layer 31 may be formed to fully cover the display element 22.

The first inorganic layer 31 may be a single layer including an oxide, a nitride or an oxynitride, or a combination thereof. In detail, the first inorganic layer 31 may include at least one of SiNx, $Al_2O_3$, $SiO_2$, $TiO_2$, SiON, AZO, ZnO, and ZrO. The first inorganic layer 31 may include a low melting point glass, such as SnO. The first inorganic layer 31 may be deposited using one of various deposition methods, such as chemical vapor deposition (CVD), atomic layer deposition (ALD), and sputtering.

Figure 5:
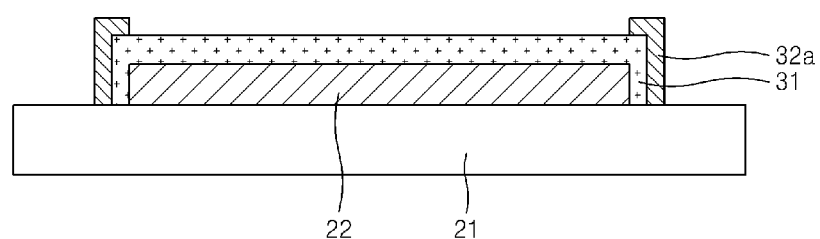

Referring to FIG. 5, a first organic layer 32a is formed on edges of the first inorganic layer 31. The first organic layer 32a may be formed on the first inorganic layer 31 not to overlap the display element 22. However, embodiments of the inventive concept are not limited thereto, and a partial area of the first organic layer 32a may overlap edges of the display element 22.

Because the first organic layer 32a is formed on the substrate 21 to only cover the edges of the first inorganic layer 31, the first organic layer 32a may be formed using an opaque material to which an inorganic filler is added, so as to improve adhesion strength to the substrate 21 or moisture permeability of the first organic layer 32a. For example, the first organic layer 32a may be formed using an epoxy-based material or acryl-based material having high adhesion strength. However, embodiments of the inventive concept are not limited thereto. The adhesion strength or moisture permeability of the first organic layer 32a may be greater than that of the second organic layer 32b. When the first organic layer 32a is formed using the inkjet method, the first organic layer 32a may be formed using a material having viscosity of about 10 to about 20 CPS. When the first organic layer 32a is formed using the jet dispenser, the first organic layer 32a may be formed using a high viscosity material having viscosity of about 1000 to about 100,000 CPS.

Because the first organic layer 32a is formed of a polymer material having high adhesion strength to the substrate 21, the first organic layer 32a may serve as a dam for preventing a second organic layer 32b that will be described below from overflowing into an undesired area when the second organic layer 32b is formed.

Figure 6:
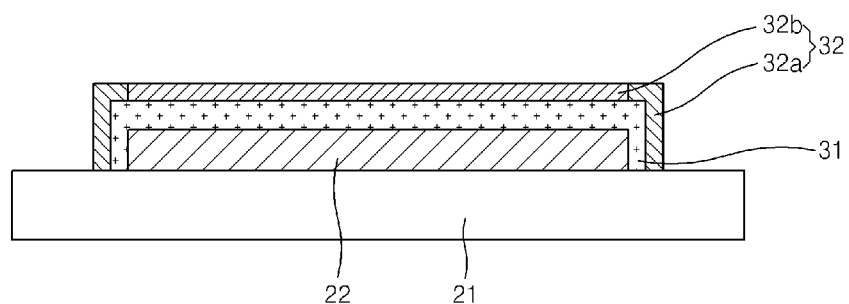

Referring to FIG. 6, the second organic layer 32b is formed on the first inorganic layer 31 in which the first organic layer 32a is not formed, so as to overlap the display element 22.

Because the second organic layer 32b is formed on the display element 22 in which an image is displayed, the second organic layer 32b may be formed using an acryl-based material, a silicon-based material, or an epoxy-based material having high transmittance and low outgassing characteristic (impurity). For example, the second organic layer 32b may be formed using a material having light transmittance of about 95%. The light transmittance of the second organic layer 32b may be greater than that of the first organic layer 32a.

Because the leveling characteristics of the second organic layer 32b formed on the display element 22, the second organic layer 32b may be formed using a material having relatively small surface tension compared to the first organic layer 32a. However, embodiments of the inventive concept are not limited thereto.

The first organic layer 32a and the second organic layer 32b have different characteristics. The first and second organic layers 32a and 32b may be formed using an inkjet method or a jet dispenser, thereby forming an organic layer 32 on the inorganic layer 31.

Figure 7:
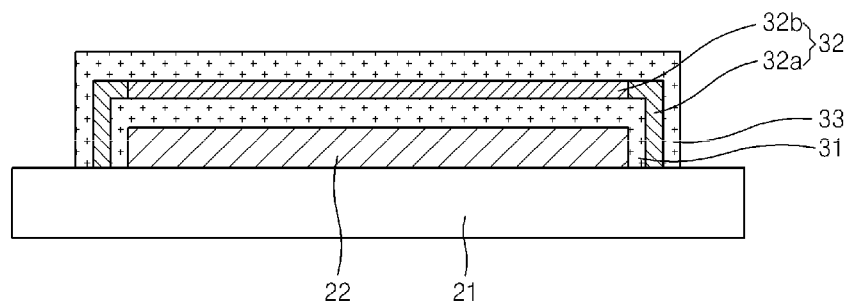

Referring to FIG. 7, a second inorganic layer 33 is formed on the organic layer 32.

The second inorganic layer 33 may be deposited to fully cover the organic layer 32. The second inorganic layer 33 may be a single layer including a oxide, a nitride or an oxynitride, or a combination thereof. In detail, the second inorganic layer 33 may include at least one of SiNx, $Al_2O_3$, $SiO_2$, $TiO_2$, SiON, AZO, ZnO, and ZrO. The second inorganic layer 33 may include a low melting point glass, such as SnO. The second inorganic layer 33 may be formed using one of various deposition methods, such as CVD, ALD, and sputtering.

Figure 8:
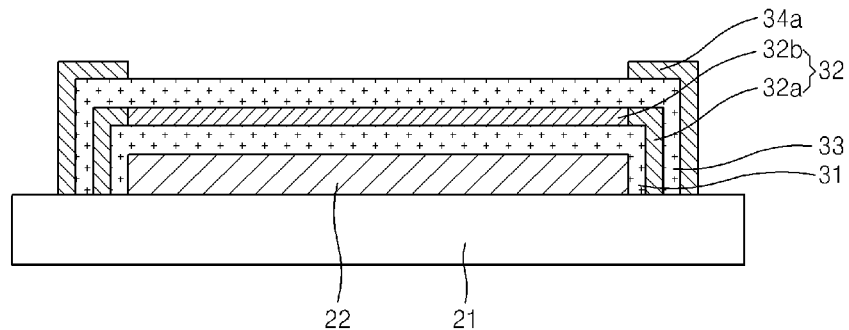

Referring to FIG. 8, a first organic layer 34a is formed on edges of the second inorganic layer 33. The first organic layer 34a may be formed on the second inorganic layer 33 not to overlap the display element 22. However, embodiments of the inventive concept are not limited thereto. The first organic layer 34a may overlap the edges of the display element 22.

Because the first organic layer 34a is formed on the substrate 21 by covering the edges of the second inorganic layer 33, the first organic layer 34a may be formed using an opaque material to which an inorganic filler is added, so as to improve adhesion strength or moisture permeability of the first organic layer 34a. For example, the first organic layer 34a may be formed using an epoxy- or acryl-based material having high adhesion strength. However, embodiments of the inventive concept are not limited thereto. When the first organic layer 34a is formed using the inkjet method, the first organic layer 34a may be formed using a material having viscosity of about 10 to about 20 CPS. When the first organic layer 34a is formed using the jet dispenser, the first organic layer 34a may be formed using a high viscosity material having viscosity of about 1000 to about 100,000 CPS.

Because the first organic layer 34a is formed using a polymer material having high adhesion strength, the first organic layer 34a may serve as a dam for preventing a second organic layer 34b that will be described below from overflowing into an undesired area when the second organic layer 34b is formed.

Figure 9:
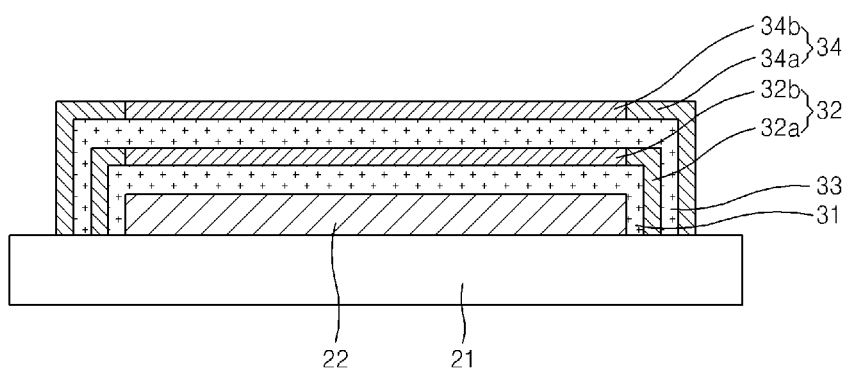

Referring to FIG. 9, the second organic layer 34b is formed on the second inorganic layer 33 in which the first organic layer 34a is not formed, so as to overlap the display element 22.

Because the second organic layer 34b is formed on the display element 22 in which the image is displayed, the second organic layer 34b may be formed using an acryl-based material, silicon-based material, or epoxy-based material having high transmittance and low outgassing (impurity) characteristic. For example, the second organic layer 34b may be formed using a material having light transmittance of about 95%.

Because the leveling characteristics of the second organic layer 34b formed on the display element 22, the second organic layer 34b may be formed using a material having small surface tension. However, embodiments of the inventive concept are not limited thereto.

Each of the second organic layers 32b and 34b formed on the first and second inorganic layers 31 and 33 may have the same characteristic and material; however, embodiments of the inventive concept are not limited thereto.

The first organic layer 34a and the second organic layer 34b have different characteristics. The first and second organic layers 34a and 34b are formed using the inkjet method or the jet dispenser, thereby forming an organic layer 34 on the second inorganic layer 33.

Figure 10:
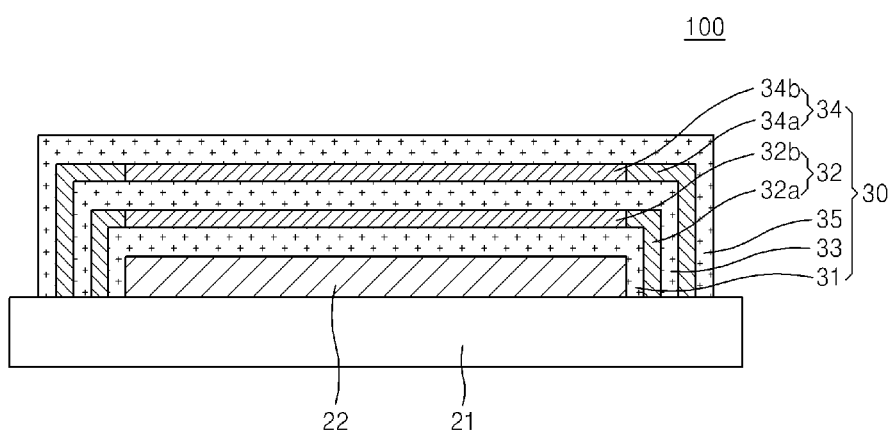

Referring to FIG. 10, a third inorganic layer 35 is formed on the organic layer 34.

The third inorganic layer 35 may be deposited to fully cover the organic layer 34. The third inorganic layer 35 may be a single layer including an oxide, a nitride or an oxynitride, or a combination thereof. In detail, the third inorganic layer 35 may include at least one of SiNx, $Al_2O_3$, $SiO_2$, $TiO_2$, SiON, AZO, ZnO, and ZrO. The third inorganic layer 35 may include a low melting point glass, such as SnO. The third inorganic layer 35 may be deposited using one of various deposition methods, such as CVD, ALD, and sputtering.

Figure 11:
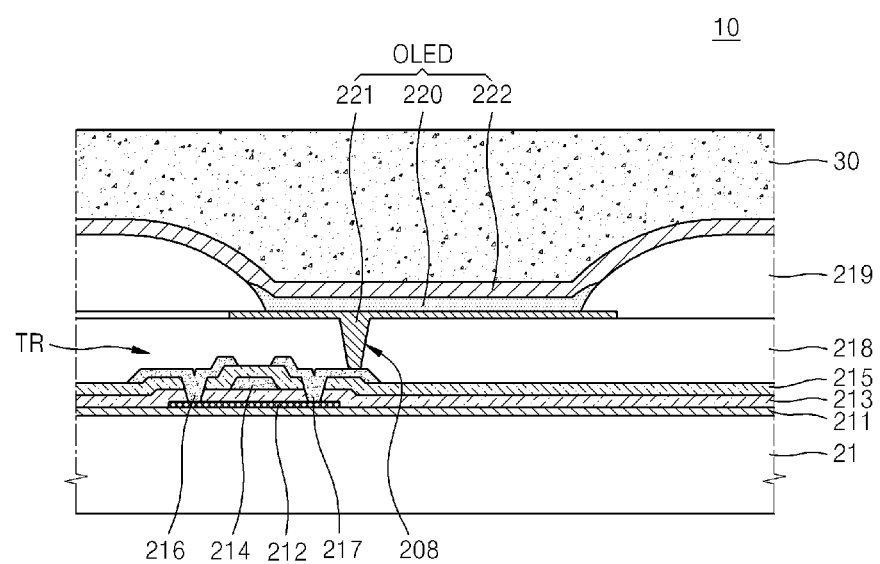
FIG. 11 is a cross-sectional view schematically illustrating a display panel according to an embodiment of the inventive concept.

FIG. 11 is a cross-sectional view schematically illustrating a display panel 10 according to an embodiment of the inventive concept.

The display panel 10 may include a plurality of organic light-emitting devices (OLEDs) that are spaced apart from each other by a gap, and a thin film transistor TR. The plurality of organic light-emitting devices (OLEDs) and the thin film transistor TR may be formed on a substrate 21. The substrate 21 may be formed using a glass material, a plastic material, or a metal material.

A buffer layer 211 may be formed on the substrate 21. The buffer layer 211 may provide a planarized surface to an upper part of the substrate 21 and may include an insulating material so as to prevent moisture and foreign substances from permeating in a direction of the substrate 21.

A display element 22 such as thin film transistor TR, a capacitor (not shown), and an organic light-emitting device (OLED) may be formed on the buffer layer 211. The thin film transistor TR may include an active layer 212, a gate electrode 214, and source/drain electrodes 216 and 217. The organic light-emitting device (OLED) may include a first electrode 221, a second electrode 222, and an intermediate layer 220.

In detail, the active layer 212 formed in a pattern may be disposed on a top surface of the buffer layer 211. The active layer 212 may include an inorganic semiconductor material such as silicon, an organic semiconductor material, or an oxide semiconductor material and may be formed by a well-known method. The active layer 212 may have a source/drain region doped with a p-type dopant or a n-type dopant under the source/drain electrodes 216 and 217.

A gate insulating layer 213 may be formed on an upper part of the active layer 212. The gate electrode 214 may be formed on an upper part of the gate insulating layer 213 so as to correspond to the channel layer (not shown).

An interlayer insulating layer 215 is formed to cover the gate electrode 214, and the source/drain electrodes 216 and 217 are formed on the interlayer insulating layer 215 and may be formed to contact the source/drain region.

A planarization layer 218 is formed to cover the source/drain electrodes 216 and 217, and an additional insulating layer (not shown) may be further formed on an upper part of the planarization layer 218.

A first electrode 221 may be formed on the planarization layer 218 or the additional insulating layer. The first electrode 221 may be formed to be electrically connected to one of the source/drain electrodes 216 and 217 through a through a contact hole 208.

A pixel defining layer 219 may be formed to expose the first electrode 221. After an opening is formed in the pixel defining layer 219, the intermediate layer 220 including an organic emission layer may be formed on the first electrode 221. The pixel defining layer 219 defines a pixel area and a non-pixel area. That is, the opening of the pixel defining layer 219 is a substantial pixel area.

The second electrode 222 may be formed on the intermediate layer 220. The first electrode 221 may be patterned in each pixel, and the second electrode 222 may not be patterned and apply a common voltage to all pixels.

In the drawings, although only one organic light-emitting device (OLED) is illustrated, the display panel 10 may include a plurality of organic light-emitting devices (OLEDs). One pixel may be formed in each organic light-emitting device (OLED). A red, green, blue, or white color may be realized in each pixel.

However, embodiments of the inventive concept are not limited thereto. The intermediate layer 220 may be commonly formed in the entire area of the planarization layer 218 regardless of the position of a pixel. In this case, the organic emission layer may be formed by vertically stacking layers including an emission material that emits red, green, and blue colors, for example, or by mixing the layers. Of course, if the organic emission layer emits a white light, a combination of other colors may be realized. Also, a color conversion layer for converting the emitted white color into a color, or a color filter may be further provided.

The encapsulation layer 30 of FIG. 1 may be disposed on the organic light-emitting device (OLED) and the pixel defining layer 219, and may serve to cover and protect the organic light-emitting device (OLED).

It should be understood that the exemplary embodiments described herein should be considered in a descriptive purpose only and not be used for purposes of limitation. Descriptions of features or aspects within each embodiment should typically be considered as available for other similar features or aspects in other embodiments.

While one or more embodiments of the inventive concept have been described with reference to the figures, it will be understood by those of ordinary skill in the art that various changes in form and details may be made therein without departing from the spirit and scope of the inventive concept as defined by the following claims.

What is claimed is:

1. A display apparatus comprising:
a substrate including a display area and a periphery;
a display element disposed on the display area of the substrate; and
an encapsulation layer comprising a first inorganic layer, an organic layer, and a second inorganic layer that are sequentially formed to cover the display element,
wherein the organic layer comprises:
a first organic layer formed on the periphery of the substrate so as not to overlap the display element; and
a second organic layer formed on the first inorganic layer so as to overlap the display element.

2. The display apparatus of claim 1, wherein the first organic layer has greater adhesion strength than adhesion strength of the second organic layer.

3. The display apparatus of claim 1, wherein the second organic layer has greater light transmittance than light transmittance of the first organic layer.

4. The display apparatus of claim 1, wherein the organic layer is formed using an inkjet method or a jet dispenser.

5. The display apparatus of claim 1, wherein the first organic layer is formed using an epoxy-based material or an acryl-based material.

6. The display apparatus of claim 1, wherein the first organic layer is formed using an inkjet method, the first organic layer having viscosity of about 10 to 20 CPS.

7. The display apparatus of claim 1, wherein the first organic layer is formed using a jet dispenser, the first organic layer having viscosity of about 1000 to about 100,000 CPS.

8. The display apparatus of claim 1, wherein the second organic layer has smaller surface tension than surface tension of the first organic layer.

9. The display apparatus of claim 1, wherein the second organic layer has a size that is equal to or greater than a size of the display element, so as to overlap the display element.

10. The display apparatus of claim 1, wherein the display element comprises a plurality of organic light-emitting display devices that are spaced apart from each other by a gap.

11. The display apparatus of claim 1, wherein the substrate is a flexible substrate.

12. A display apparatus comprising:
a substrate including a display area and a periphery;
a display element disposed on the display area of the substrate; and
an encapsulation layer comprising an inorganic layer and an organic layer that are alternately formed, so as to cover the display element, a top layer of the encapsulation layer being an inorganic layer,
wherein the organic layer comprises:
a first organic layer formed on the periphery of the substrate so as not to overlap the display element; and
a second organic layer formed on the same layer as the inorganic layer so as to overlap the display element.

13. The display apparatus of claim 12, wherein the first organic layer and the second organic layer are formed using an inkjet method or a jet dispenser.

14. The display apparatus of claim 12, wherein the first organic layer has greater adhesion strength than adhesion strength of the second organic layer and comprises an inorganic filler.

15. The display apparatus of claim 12, wherein the second organic layer has greater light transmittance than light transmittance of the first organic layer and has a size that is equal to or greater than a size of the display element, so as to overlap the display element.

16. The display apparatus of claim 12, wherein the substrate is a flexible substrate, and the display element comprises a plurality of organic light-emitting devices that are spaced apart from each other by a gap.

17. A method of fabricating a display apparatus, the method comprising:
forming a display element on a substrate, the substrate including a display area and a periphery;
forming a first inorganic layer on the substrate so as to cover the display element;
forming a first organic layer on the periphery of the substrate so as not to overlap the display element;
forming a second organic layer on a same layer as the first inorganic layer so as to overlap the display element; and
forming a second inorganic layer on the first organic layer and the second organic layer.

18. The method of claim 17, wherein the first organic layer and the second organic layer are formed using an inkjet method or a jet dispenser.

19. The method of claim 17, wherein the first organic layer has greater adhesion strength than adhesion strength of the second organic layer, and the second organic layer has greater light transmittance than light transmittance of the first organic layer.

20. The method of claim 17, wherein the substrate is a flexible substrate, and the display element comprises a plurality of organic light-emitting devices that are spaced apart from each other by a gap.

* * * * *